(12) United States Patent
Choi (10) Patent No.: US 7,279,422 B2
(45) Date of Patent: Oct. 9, 2007

(54) SEMICONDUCTOR DEVICE WITH SILICIDE FILM AND METHOD OF MANUFACTURING THE SAME

(75) Inventor: Chel-jong Choi, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 184 days.

(21) Appl. No.: 10/915,381

(22) Filed: Aug. 11, 2004

(65) Prior Publication Data

US 2005/0067661 A1    Mar. 31, 2005

(30) Foreign Application Priority Data

Sep. 30, 2003   (KR) .................. 10-2003-0067910

(51) Int. Cl.
*H01L 21/44* (2006.01)
(52) U.S. Cl. .............. 438/682; 438/684; 438/685; 257/412; 257/413; 257/E29.161
(58) Field of Classification Search ........ 257/408, 257/410, 412; 438/682, 683, 656–658, 648, 438/649, 653, 655, 605, 651, 660, 685, 523, 438/586, 664, 453, 233, 976
See application file for complete search history.

(56) References Cited

U.S. PATENT DOCUMENTS

| 5,840,626 A | * | 11/1998 | Ohguro ............... 438/649 |
| 5,915,204 A | * | 6/1999 | Sumi .................. 438/683 |
| 6,165,903 A | * | 12/2000 | Besser et al. .......... 438/682 |
| 6,277,743 B1 | * | 8/2001 | O'Brien ................ 438/682 |
| 6,410,427 B1 | | 6/2002 | Hu |
| 6,432,805 B1 | * | 8/2002 | Paton et al. ............ 438/592 |
| 6,586,333 B1 | * | 7/2003 | Woo et al. ............. 438/682 |
| 6,800,553 B2 | * | 10/2004 | Jung et al. ............. 438/682 |
| 2003/0042515 A1 | * | 3/2003 | Xiang et al. ............ 257/288 |

(Continued)

OTHER PUBLICATIONS

M J Cooke and G Hassall, Low-pressure sources for etching and deposition, Aug. 19, 2002, Institute of Physics Publishing—Plasma Sources Science Technology, 11 (2002), pp. A74-A79.*

(Continued)

*Primary Examiner*—Jerome Jackson
*Assistant Examiner*—Paul Budd
(74) *Attorney, Agent, or Firm*—Buchanan Ingersoll & Rooney PC (57) ABSTRACT

Provided is a semiconductor device having a suicide thin film with thermal stability and a method of manufacturing the same. The semiconductor device includes a silicon substrate containing Si a gate oxide film formed on the silicon substrate, a gate electrode containing Si formed on the gate oxide film, a spacer formed on side walls of the gate oxide film and the gate electrode, a LDD region formed in the silicon substrate under the spacer, a source/drain region formed in the silicon substrate, a NiSi thin film formed on the source/drain region and the gate electrode by reacting a Ni film with the source/drain region and the gate electrode; and a nitride film formed on the NiSi thin film formed by surface treating the nickel film using Ar plasma and reacting the Ni film with nitrogen. The, a semiconductor device having the NiSi thin film has a low sheet resistance and high thermal stability can be obtained.

24 Claims, 11 Drawing Sheets

U.S. PATENT DOCUMENTS

2004/0262649 A1* 12/2004 Chang et al. ............... 257/288

OTHER PUBLICATIONS

Kittl et al., "A Ti Salicide Process for 0.10 µm Gate Length CMOS Technology", Symposium on VLSI Technology Digest of Technical Papers, 1996, pp. 14-15.

Lasky et al., "Comparison of Transformation to Low-Resistivity Phase and Agglomeration of $TiSi_2$ and $CoSi_2$", IEEE, Transactions on Electron Devices, Feb. 1991, pp. 262-269, vol. 38, No. 2.

Sohn et al., "Effects of Ti-Capping on Formation and Stability of Co Silicide I. Solid Phase Reaction of Ti to CoSsi System", Journal of the Electrochemical Society, 147, Mar. 22, 1999; revised Aug. 10, 1999; pp. 373-380.

Colgan et al., "Formation and stability of silicides on polycrystalline silicon", Materials Science and Engineering, R16, 1996, pp. 43-96, Elsevier Science S.A.

Deng et al., "Salicidation process using NiSi and its device application", J. Appl. Phys. 81, Jun. 15, 1997, pp. 8047-8051.

Morimoto et al., "A NiSi Salicide Technology for Advanced Logic Devices", Tech. Dig. Int. Electron Device Meet, 1991, pp. 25.5.1-25.6.5.

Hou et al., "Improvement of Junction Leakage of Nickel Silicide Junction by a Ti-Capping Layer", IEEE Electron Device Letters, Nov. 1999, vol. 20, No. 11, pp. 572-573.

Ohguro et al., "Nitrogen-doped nickel monosilicide technique for deep submicron CMOS salicide", Tech. Dig. Int. Electron Devices Meet, 1995, pp. 453-456.

Choi et al., "Effects of Hydrogen Implantation on the Structural and Electrical Properties of Nickel Silicide", Journal of The Electrochemical Society, Jan. 2, 2002; revised Mar. 4, 2002; pp. G517-G521.

La Via et al., "Thermal stability of thin $CoSi_2$ layers on polysilicon implanted with As, $BF_2$, and Si", J. Vac. Sci. Technol B. 16(3), 1998, pp. 1129-1136, American Vacuum Society.

Choi et al., "Effects of $SiO_2$ Capping Layer on the Electrical Properties and Morphology of Nickel Silicides", Apr. 2002, Part 1, No. 4A, pp. 1969-1973, The Japan Society of Applied Physics.

(All of the above documents were cited in the specification of U.S Appl. No. 10/915,381, filed on Aug. 11, 2004).

* cited by examiner

SEMICONDUCTOR DEVICE WITH SILICIDE FILM AND METHOD OF MANUFACTURING THE SAME

This application claims the priority of Korean Patent Application No. 2003-67910, filed on Sep. 30, 2003, in the Korean Intellectual Property Office, the disclosure of which is incorporated herein in its entirety by reference.

BACKGROUND OF THE INVENTION

1. Field of the Invention

The present invention relates to a semiconductor device and a method of manufacturing the same, and more particularly, to a semiconductor device having a silicide thin film that is made thermally stable by treating a surface of a Si containing substrate using argon plasma and a method of manufacturing the same.

2. Description of the Related Art

The rapid development of manufacturing techniques for silicon devices has resulted in the attainment of submicron devices. Accordingly, contact resistance and sheet resistance increase due to the minuteness of regions for forming contacts of a gate and source/drain. This phenomenon resulted in a major reduction of operation speed of a silicon device since an increase in RC delay occurs.

To solve this problem, sheet resistance and contact resistance have been reduced by forming a silicide, which is a stable metal compound formed by a reaction between Si and a metal, in contact regions such as a gate and a source/drain. Also, a self-aligned silicide (salicide) process is now used in device manufacturing processes of next generation combined-devices by coupling a high performance LOGIC device, a logic, and a dynamic random access memory (DRAM).

Silicides commonly used for manufacturing silicon devices are $TiSi_2$ and $CoSi_2$. These two kinds of silicides have low specific resistances suitable for the operation of a device, however, according to the disclosures of J. A. Kittle et al. published in the Digest of Technical Papers of the symposium VLSI Technology, pp 14, 1996 and J. B. Lasky et al. published in the IEEE Trans. Electron Devices, 38, pp 262, 1991, the $TiSi_2$ has serious problems such as a difficulty of phase transform C-49 $TiSi_2$, which has a high specific resistance, to C-54 $TiSi_2$, which has a low specific resistance, the occurrences of a narrow line effect, in which specific resistance increase due to a reduction of a line width, and a bridge effect, which can be an electrical short between isolated devices. Also, according to the disclosures of D. K. Sohn et al., published in J. Electrochem. Soc. 147, pp 373, 2000 and E. G. Colgan et al., published in Mater. Sci. Eng. R. 16, pp 43, 1996, even though $CoSi_2$ has advantages over $TiSi_2$, there is a possibility of generating a $CoSi_2$ spike since Co reacts with Si fiercely and it is very difficult to form $CoSi_2$ in a shallow junction with a low junction leakage current since the amount of silicon required for forming $CoSi_2$ is greater than for other silicides.

Recently, according to the disclosure of F. Deng et al., published in J. Appl. Phys., 81, pp 8047, 1997, nickel mono-silicide (NiSi) which overcomes the problems of $TiSi_2$ and $CoSi_2$, has been proposed and applied to manufacture a next generation high performance silicon device.

Meanwhile, according to the disclosures of T. Morimoto et al., published in Tech. Dig. Int. Electron Devices Meet., pp 653, 1991 and T. Hou et al., published in IEEE Electron Device Letters, 20, pp 572, 1999, a NiSi thin film that has a low specific resistance of 14 $\mu\Omega \cdot cm$ can be obtained using a single heat treatment, and the obtained NiSi thin film has no narrow line effect or bridge effect that occurs in $TiSi_2$. Moreover, the amount of Si required to form the NiSi with a predetermined thickness is much less than for other suicides, especially, $CoSi_2$. Therefore, NiSi is a suitable silicide to be applied to a next generation Si device having a shallow junction.

When practically applying NiSi to a Si device, NiSi drastically increases the sheet resistance as the heat treatment temperature increases, that is, thermal stability is reduced. These problems are mainly caused by the oxidation of the NiSi thin film due to contamination of oxygen, as disclosure in T. Ohguro et al., published in Tech. Dig. Int. Electron Devices Meet., pp 453, 1995. Also, if the NiSi thin film is oxidized, severe undulation is generated at an interface between NiSi and a Si substrate and the surface morphology of the NiSi thin film severely degrades.

To solve these problems, a TiN capping layer is widely used. As disclosed in Japanese Patent Laid-Open Publication 7-38104, a diffusion barrier layer is formed to prevent oxygen contamination by forming a TiN capping layer on Ni. However, while oxygen contamination can be effectively prevented when the capping layer is used, it is difficult to apply a capping layer to a shallow junction due to a large undulation at an interface between the NiSi thin film and a Si substrate, as disclosed in T. Ohguro et al., published in Tech. Dig. Int. Electron Devices Meet., pp 453, 1995.

Another method of reducing oxidation of the NiSi thin film by oxygen contamination is disclosed in U.S. Pat. No. 5,840,626. This is a method of forming NiSi by heat treating a Ni thin film after depositing Ni on Si substrate with a small amount of nitrogen. When NiSi is formed by this method, nitridation of a surface of the NiSi thin film occurs, and the nitridation of the surface of the NiSi thin film effectively prevents the oxidation of the NiSi thin film. However, this method has a drawback in that a large amount of nitrogen must be added to the Ni thin film since Ni does not readily reacts with nitrogen, as indicated by U.S. Pat. No. 6,410,427. Also, this method has a drawback in that the temperature required for heat treatment when forming a NiSi thin film having low resistance increases as the concentration of nitrogen increases.

SUMMARY OF THE INVENTION

The present invention provides a semiconductor device that includes a metal silicide film having improved characteristics using NiSi.

The present invention also provides a method of manufacturing a semiconductor device that includes a metal silicide film having improved characteristics using NiSi.

According to an aspect of the present invention, there is provided a semiconductor device having a NiSi thin film, comprising a silicon substrate containing Si, a gate oxide film formed on the silicon substrate, a gate electrode containing Si formed on the gate oxide film, a spacer formed on side walls of the gate oxide film and the gate electrode, a LDD region formed in the silicon substrate under the spacer, a source/drain region formed in the silicon substrate, a NiSi thin film formed on the source/drain region and the gate electrode by reacting a Ni film with the source/drain region and the gate electrode; and a nitride film formed on the NiSi thin film formed by surface treating the Ni film using Ar plasma and reacting the Ni film with nitrogen.

According to another aspect of the present invention, there is provided a method of manufacturing a semiconductor device that includes a gate oxide film, a gate electrode containing Si and source/drain region on a Si substrate, comprising forming a metal layer on the gate electrode and the source/drain region, processing a surface of the metal layer using Ar plasma, and forming a silicide thin film by annealing the metal layer formed on the silicon substrate at a predetermined temperature.

According to another aspect of the present invention, there is provided a method of manufacturing a semiconductor device having a NiSi thin film, comprising sequentially forming a gate oxide film layer and a gate electrode layer on a silicon substrate that contains Si, forming a gate electrode and a gate oxide film by patterning the gate oxide film layer and the gate electrode layer to a predetermined shape, forming a LDD region in the silicon substrate using the gate oxide film and the gate electrode as a mask, forming spacers on side walls of the gate oxide film and the gate electrode, forming a source/drain region using the gate electrode and the spacers as a mask, forming a Ni layer on the gate electrode and the source and drain region, processing a surface of the Ni layer with Ar plasma, and forming NiSi by annealing the Ni layer at a predetermined temperature.

The silicon substrate may be composed of a material containing Si selected from the group consisting of single crystal Si, poly crystal Si, doped Si, amorphous Si, $Si_xGe_{1-x}$ (X is 0<X<1), $Si_xN_{1-x}$ (X is 0<X<1), and SiC.

Also, the method of manufacturing a semiconductor device having a silicide thin film further can comprise removing an unreacted metal layer after forming the silicide thin film.

Also, if the metal layer is composed of Ni, the surface of the metal layer may be processed with Ar plasma under approximately 25–35 W RF power, approximately 900–1100 W of ICP power, and a flow rate of approximately 15–25 sccm of Ar using ICP.

The method of manufacturing a semiconductor device further comprising rapid thermal annealing (RTA) the silicon substrate that includes the metal layer processed with Ar plasma at a temperature of approximately 100–900° C. under a nitrogen atmosphere for a predetermined time for forming a silicide thin film.

Also, the nitride film is formed on the NiSi thin film during annealing at a predetermined temperature.

Also, the nitride film is composed of one selected from the group consisting of NiSiN, SiN, and NiN.

Also, the temperature range of annealing can be determined considering the kind of metal silicide to be formed and temperature range at which the metal silicide is formed.

Also, when the silicide thin film is composed of NiSi, the predetermined temperature range for annealing is approximately 300–800° C.

Also, the semiconductor device can be one of a CMOS logic device, a memory device, and an embedded memory device.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

A semiconductor device including an NiSi thin film with thermal stability and a method of manufacturing the same will now be described more fully with reference to the accompanying drawings in which embodiments of the present invention are shown. Like reference numerals refer to the like elements throughout the drawings.

According to a method of manufacturing a silicon device using a NiSi thin film, when heat treating a surface of a Ni film by performing Ar plasma processing after depositing the Ni, the surface of the Ni is activated to easily react with nitrogen. Then, nitridation occurs on the surface of the Ni because the Ni reacts with RTA ambient nitrogen during heat treating, and the nitrided surface of Ni acts as a diffusion barrier against oxygen. Therefore, a uniform reaction between Ni and Si can occur and then a NiSi thin film having a smooth surface morphology and interface uniformity can be formed.

FIGS. 1A through 1E are cross-sectional views illustrating a method of manufacturing a semiconductor device having a NiSi thin film with thermal stability according to an embodiment of the present invention.

Figure 1A:
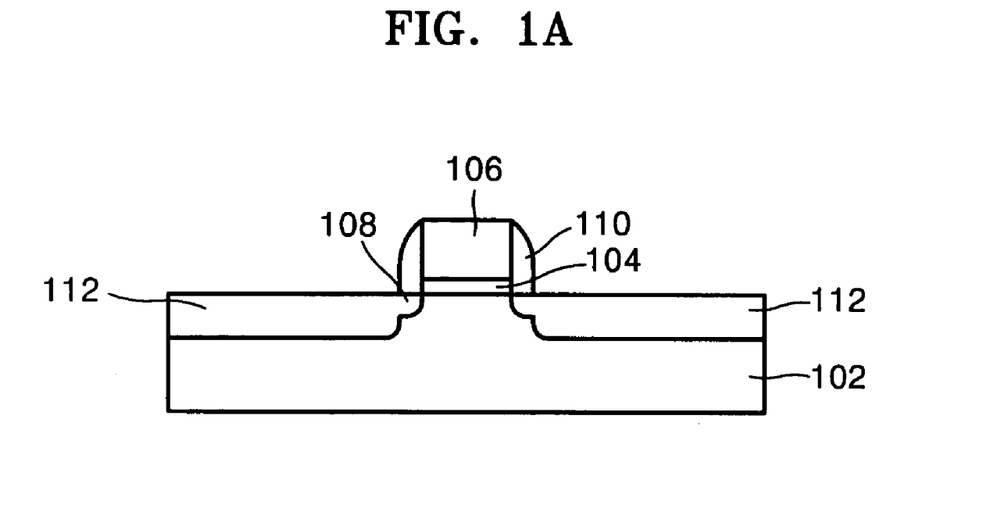
FIGS. 1A through 1E are cross-sectional views illustrating a method of manufacturing a semiconductor device having a thermally stable silicide thin film according to an embodiment of the present invention.

Referring to FIG. 1A, a gate oxide film layer and a gate electrode layer composed of a material such as polysilicon are sequentially formed on a silicon substrate 102 which contains silicon. Then, a gate oxide film 104 and a gate electrode 106 are formed on a silicon substrate 102 by patterning the gate electrode layer and the gate oxide film layer to a predetermined shape using photolithography and an etching process. According to the present embodiment, the silicon substrate 102 may be composed of a material containing Si selected from the group consisting of single crystal Si, poly crystal Si, doped Si, amorphous Si, $Si_xGe_{1-x}$ (where x is 0<x<1), $SixN_{1-x}$ (where x is 0<x<1), or SiC can be used.

Next, a lightly doped drain (LDD) region 108 is formed in the silicon substrate 102 by ionic injecting a low concentration of dopant using the gate electrode 106 and the gate oxide film 104 as a mask. Spacers 110 are then formed on side walls of the gate oxide film 104 and the gate electrode 106. The gate electrode 106 can be formed of polysilicon containing Si.

Next, source/drain regions 112 are formed in the silicon substrate 102 by ionic injecting a high concentration of dopant using the gate electrode 106 and the spacers 110 as a mask. This completes a basic structure of a metal oxide semiconductor (MOS).

Next, a native oxide film can be removed from a region where the silicide is to be formed. A reagent used for removing the native oxide film is HF, but other reagents that can remove the native oxide film can be used.

Figure 1B:
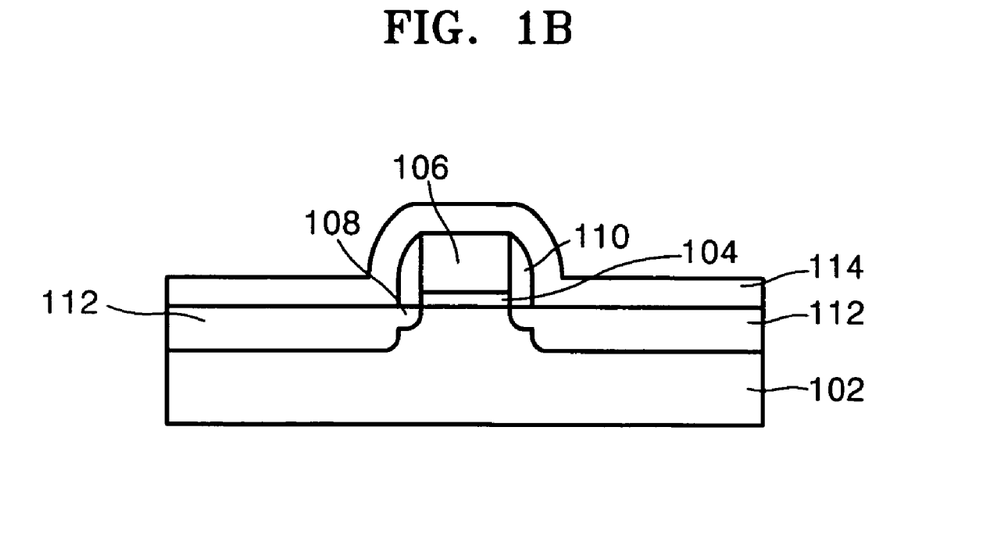

Referring to FIG. 1B, a metal thin film 114 composed of a material such as Ni is deposited to a desired thickness using an apparatus such as e-beam evaporator after the native oxide film is removed. Methods for depositing the metal thin film 114 other than using the e-beam evaporator include sputtering, chemical vapour deposition (CVD), physical vapour deposition (PVD), metal-organic chemical vapor deposition (MOCVD), and molecular beam epitaxy (MBE). However, the present invention is not limited thereto.

Also, the metal thin film 114 composed of Ni can be formed to a thickness of approximately 10–100 nm. However, the aim of the present invention can be achieved even if the thickness of the metal is not confined thereto. Also, the metal thin film 114 can be composed of at least one selected from the group consisting of Ni, Ti, Pt, Pd, Ir, Ta, Nb, V, Cr, Hf, Zr, Mo and an alloy composed of these metals.

Figure 1C:
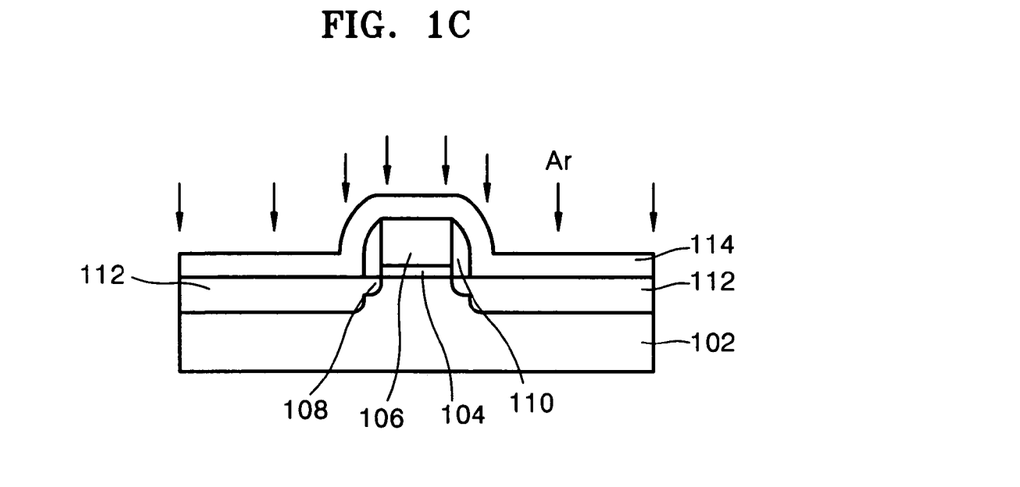

Referring to FIG. 1C, a surface of the metal thin film 114 is processed with Ar. In the present embodiment, when the metal thin film 114 is composed of Ni, the surface of the metal thin film 114 is processed using inductive coupled plasma (ICP) with approximately 25–35 W of RF power, 900–1,100 W of ICP power, and a flow rate of 15–25 sccm of Ar.

Figure 1D:
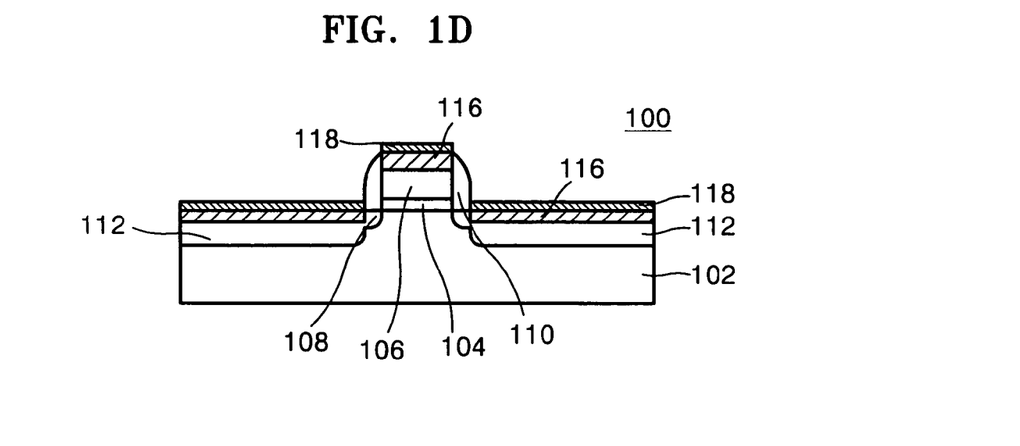

Next, referring to FIG. 1D, the resultant product is rapid thermal annealed (RTA) in the presence of nitrogen gas to form NiSi.

The temperature range for annealing can be determined considering the kind of metal silicide to be formed and temperature range of at which the metal silicide is formed. For example, for forming NiSi, a desirable temperature range is approximately 300–800° C. because if the temperature is below 300° C., $Ni_2Si$ can be formed and if temperature exceeds 800° C., $NiSi_2$ can be formed.

During RTA, a metal silicide thin film 116 composed of NiSi is formed as a result of a reaction between Ni and Si due to the diffusion of Ni atoms of the metal thin film 114 into the source and drain regions 112 of the silicon substrate 102 and the gate electrode 106 composed of polysilicon contacting the metal thin film 114.

During the annealing at a predetermined temperature, a nitridation film 118 is formed on the metal silicide thin film 116, and the nitridation film 118 is composed of one of NiSiN, SiN, and NiN.

When the surface of the Ni is processed with Ar plasma, a large amount of Ni in the surface of the metal silicide thin film 116 is activated and then nitridation occurs on the surface of the NiSi thin film due to a reaction with nitrogen used as an RTA ambient gas. Therefore, the nitridation on the surface of the NiSi thin film acts as a diffusion barrier against oxygen that can be generated during RTA process, thereby enabling a uniform reaction between Ni and Si. As a result, surface morphology of the metal suicide thin film 116 and the uniformity of the interface between the metal silicide thin film 116 and the silicon substrate 102 is improved.

In the present embodiment, the metal silicide thin film 116 is formed since the metal thin film 114 is composed of Ni. However, if the metal thin film 114 is composed of one selected from the group consisting of Ni, Ti, Pt, Pd, Ir, Ta, Nb, V, Cr, Hf, Zr, Mo and an alloy of these metals, various metal silicide thin film can be formed.

Also, in the present embodiment, the metal thin film 114 is formed directly on the silicon substrate 102, however, the metal thin film 114 can be formed on a diffusion barrier (not shown) interposed between the metal thin film 114 and the silicon substrate 102. The diffusion barrier can be composed of at least one material selected from the group consisting of Mo, Ta, Mn, Cr, W, Pd, Au, Ag, Cu, Hf, Fe, Zn, Ru, Pb, Mg and an alloy of these metals.

Figure 1E:
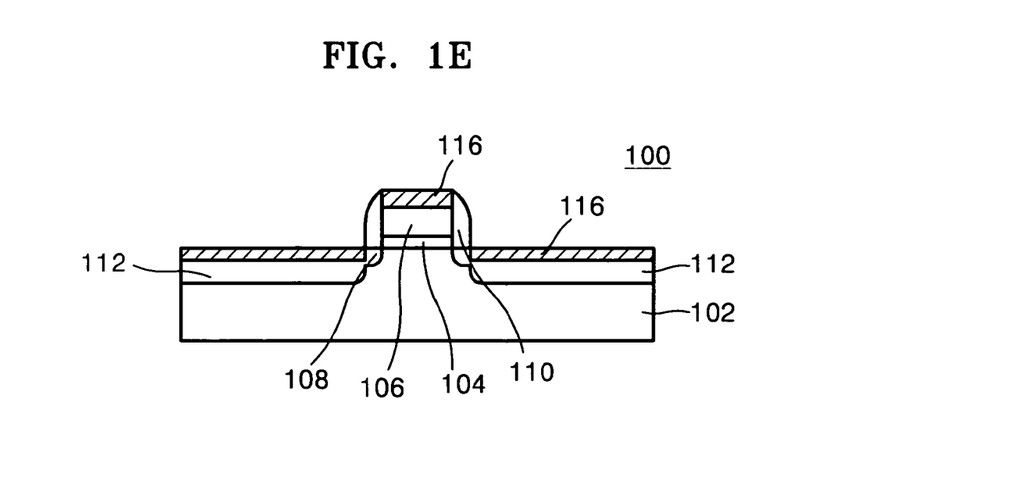

Referring to FIG. 1E, metal that did not react with the silicon substrate 102 and the gate electrode 106 during RTA is removed. Finally, semiconductor devices having a silicide thin film with thermal stability are obtained by removing the nitride film 118 formed on the metal silicide thin film 116.

Figure 2:
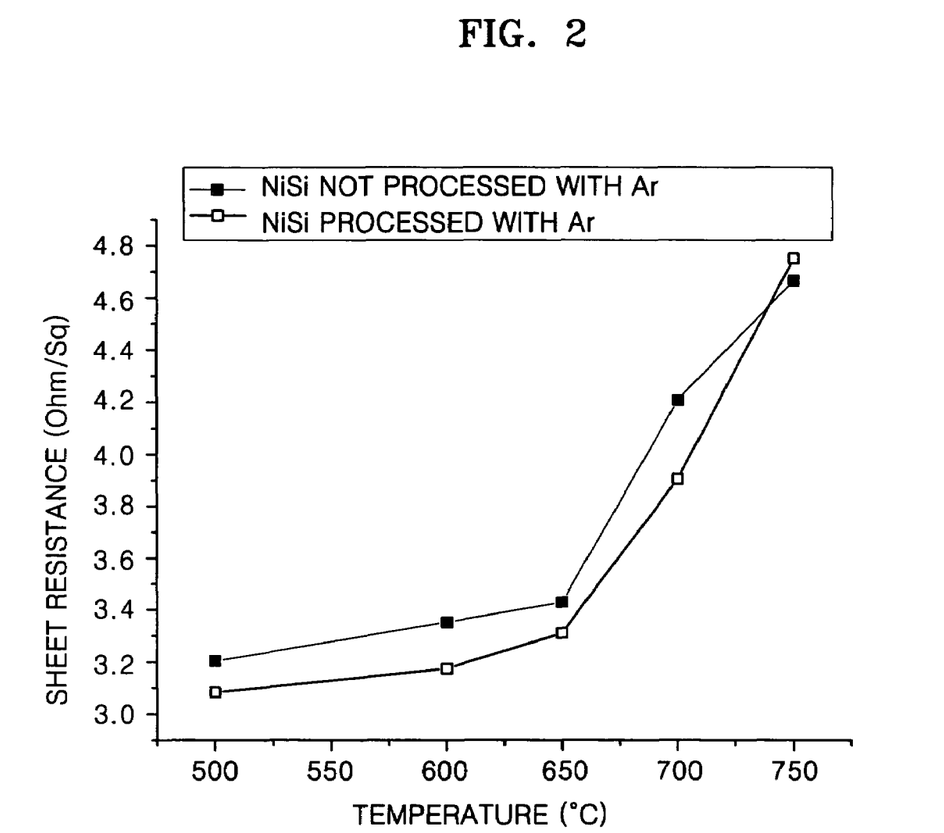
FIG. 2 is a graph illustrating sheet resistance with respect to RTA temperature for a specimen processed with argon plasma and a specimen not processed with argon plasma.

FIG. 2 is a graph illustrating sheet resistance with respect to RTA temperature for a specimen processed with Ar plasma and a specimen not processed with Ar plasma.

Sheet resistances of a semiconductor devices having an NiSi thin film with thermal stability manufactured according to the method described with reference to FIGS. 1A through 1E were measured using a four-point probe at each RTA temperature and the results are indicated by □, and sheet resistances of semiconductor devices having an NiSi thin film manufactured according to the process as depicted in FIG. 1 but RTA treated without Ar plasma processing were measured using a four-point probe at each RTA temperature and the results are indicated by ■.

Referring to FIG. 2, sheet resistances of the two specimens remain almost constant up to approximately 650° C. regardless of processing with Ar plasma, but increase drastically beyond that temperature. However, the sheet resistance of the specimen □ processed with Ar plasma is lower than that of the specimen ■ not processed with Ar plasma.

Accordingly, as shown in FIG. 2, the measured sheet resistance indicates that when the NiSi thin film is manufactured by RTA after processing the surface of Ni with Ar plasma, the sheet resistance degradation that occurs as the RTA temperature is increased can be effectively prevented.

Figure 3A:
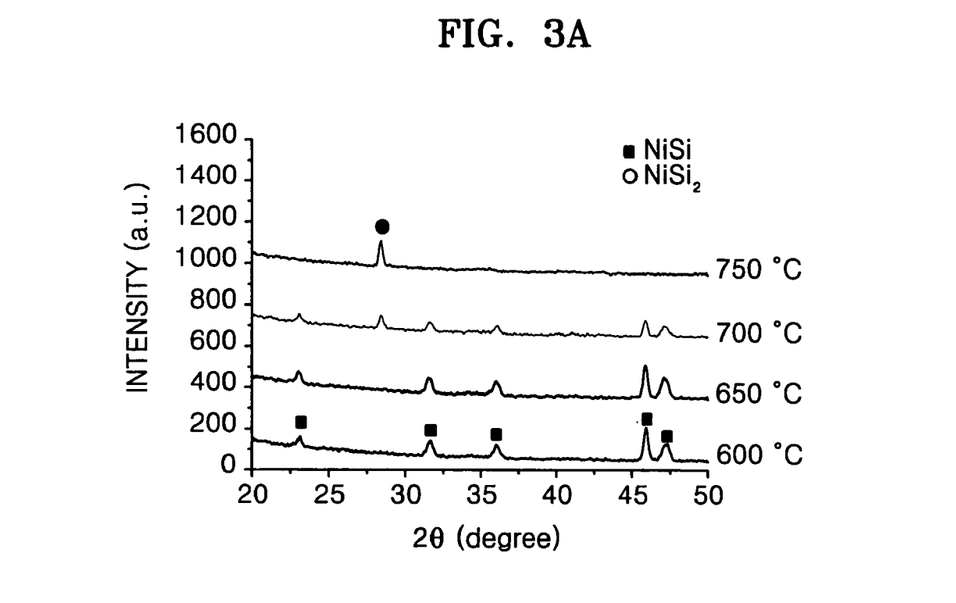
FIGS. 3A and 3B are graphs illustrating a result of glancing angle X-ray diffraction (GXRD) for various RTA temperatures of a specimen not processed with argon plasma and a specimen processed with argon plasma.
Figure 3B:
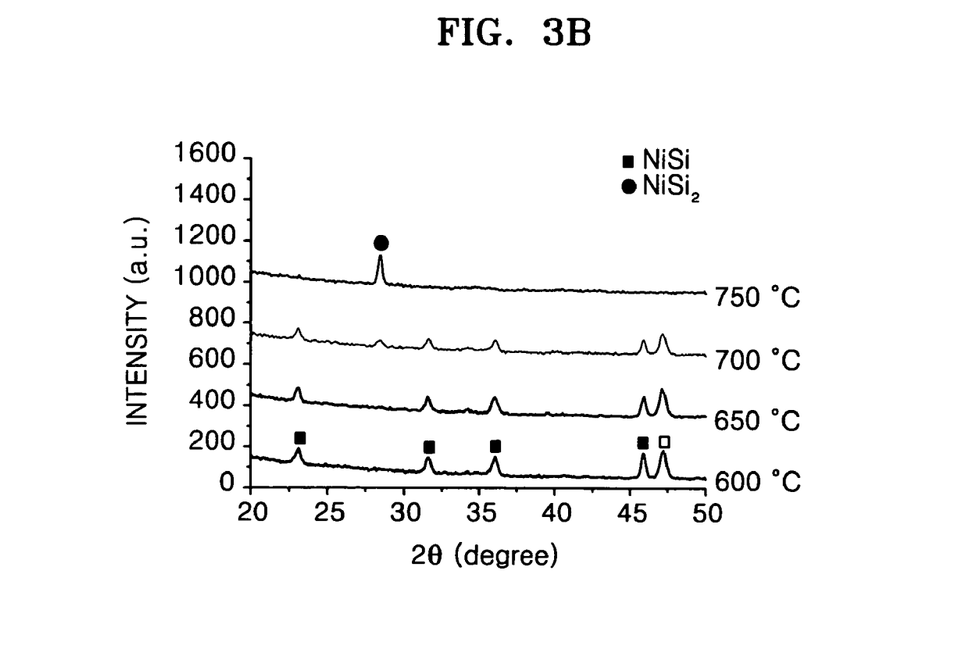

FIGS. 3A and 3B are graphs illustrating a result of glancing angle X-ray diffraction (GXRD) for various RTA temperature of a specimen not processed with Ar plasma and a specimen processed with Ar plasma.

Referring to FIGS. 3A and 3B, in both of the specimens, only NiSi exists at a temperature below approximately 600° C. and NiSi and NiSi2 co-exist at approximately 700° C., but only NiSi2 exists at temperatures above 750° C. That is, the GXRD result shows that Ar plasma processing does not affect the temperature range of NiSi formation.

Figure 4A:
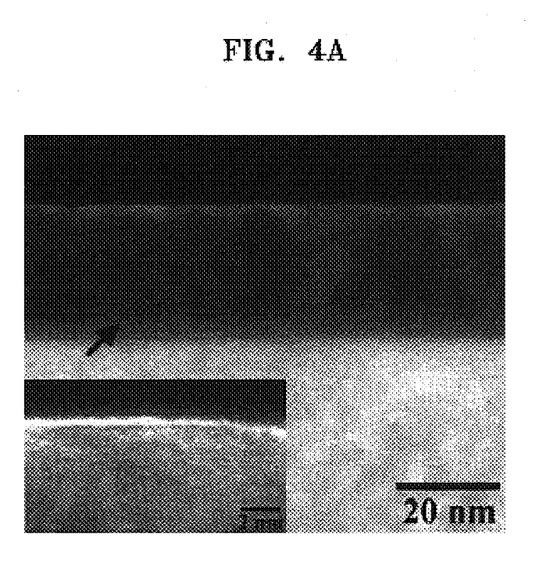
FIGS. 4A and 4B are transmission electron microscopy (TEM) images of cross-sections of an as-deposited specimen not processed with Ar plasma and an as-deposited specimen processed with Ar plasma.
Figure 4B:
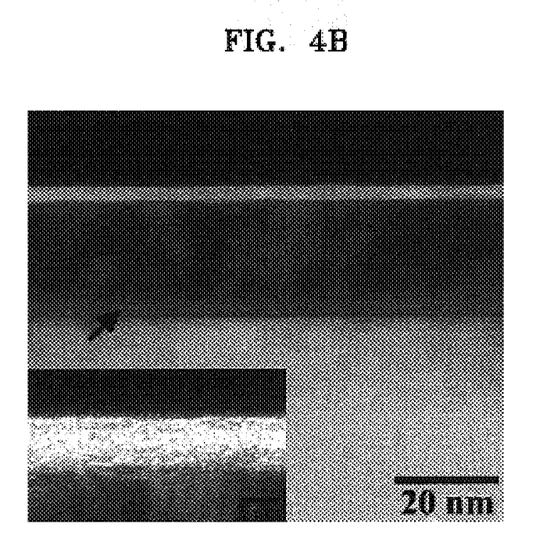

FIGS. 4A and 4B are transmission electron microscopy (TEM) images of cross-sections of an as-deposited specimen not processed with Ar plasma and an as-deposited specimen processed with Ar plasma.

In the left bottom corners of FIGS. 4A and 4B, high resolution TEM images are shown for further detailed observation of the Ni surface of each of the specimens. An Au thin film was deposited on the Ni surface before preparing a specimen to prevent additional contamination by oxygen in the course of preparing the specimen before observing the specimen using the TEM. A layer (indicated by an arrow) with a thickness of approximately 4 nm at an interface between Ni and Si was observed in each of the specimens.

The layer is thought to be a silicide layer formed in a reaction between Ni and Si when depositing Ni (Choi et al., J. Electrochem. Soc. 149, pp 517, 2002). In FIG. 4A, it is also observed that a native oxide film with a thickness of approximately 4 nm exists on the Ni surface in the case of the specimen non-processed with Ar plasma, however, in FIG. 4B, a damaged layer D", formed by an Ar plasma processing, of approximately 2.5 nm thickness is existed on the Ni surface when the specimen was processed with Ar plasma.

Figure 5A:
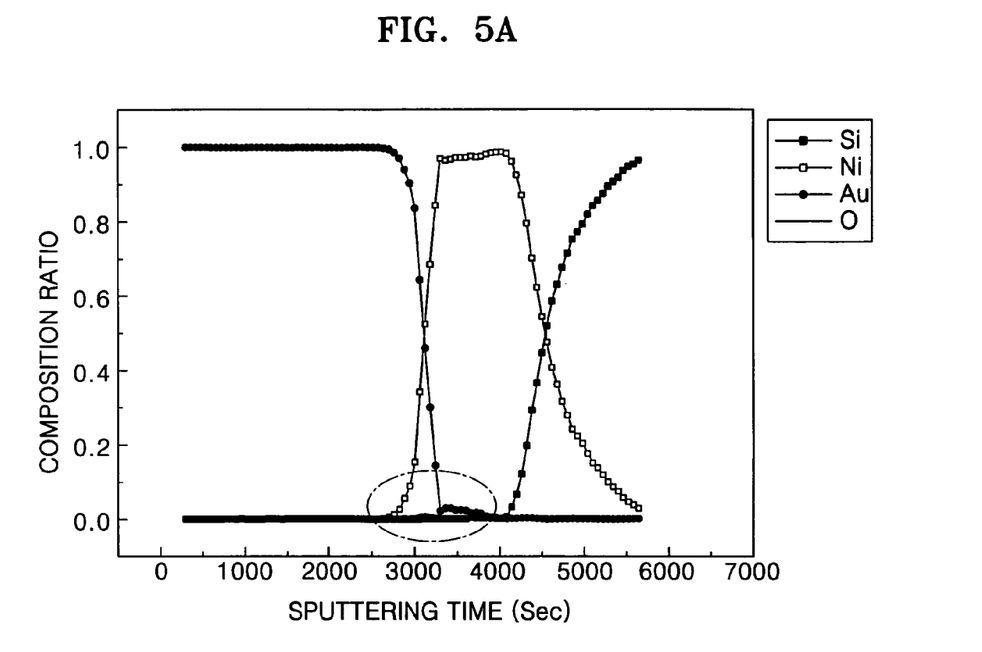
FIGS. 5A and 5B are graphs illustrating depth profiles of elements existing in as-deposited specimens not processed with Ar plasma and processed with Ar plasma measured using auger electron spectroscopy (AES)
Figure 5B:
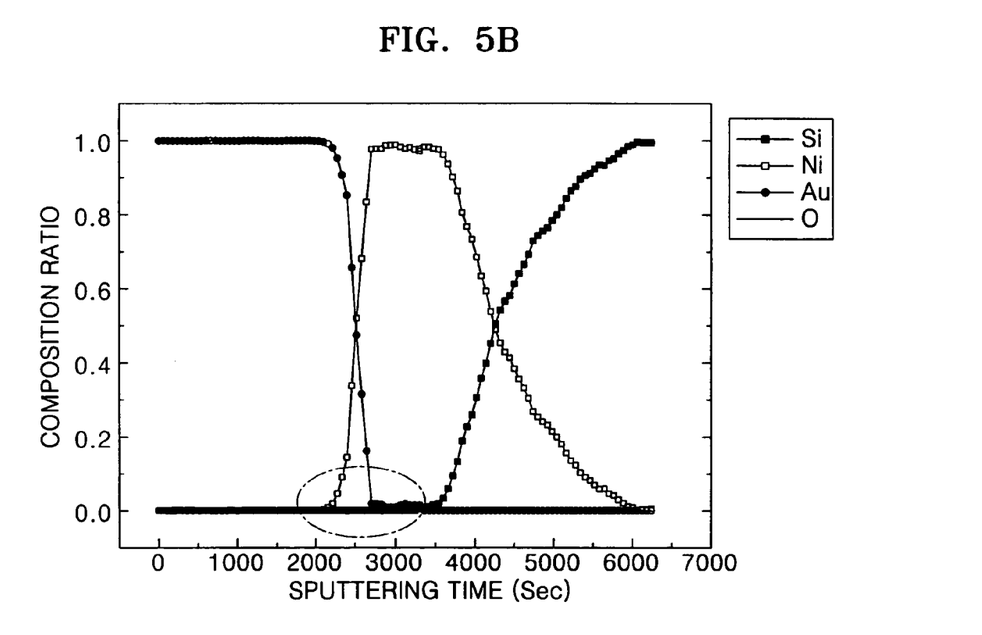

FIGS. 5A and 5B are graphs illustrating depth profiles of elements in a specimen not processed with Ar plasma and a specimen processed with Ar plasma right after deposition using auger electron spectroscopy (AES).

From the AES results, it is observed that the Ni surface was oxidized by oxygen contamination when the specimen was not processed with Ar plasma as shown in FIG. 5A, while no oxygen was observed on the Ni surface when the AES profile of the specimen was processed with Ar plasma.

In summarizing the results in FIGS. 4 and 5, it was found that the Ar plasma processing according to an embodiment of the present invention effectively prevents oxygen contamination of the Ni thin film when the Ni thin film is exposed to the air after Ni deposition.

Figure 6A:
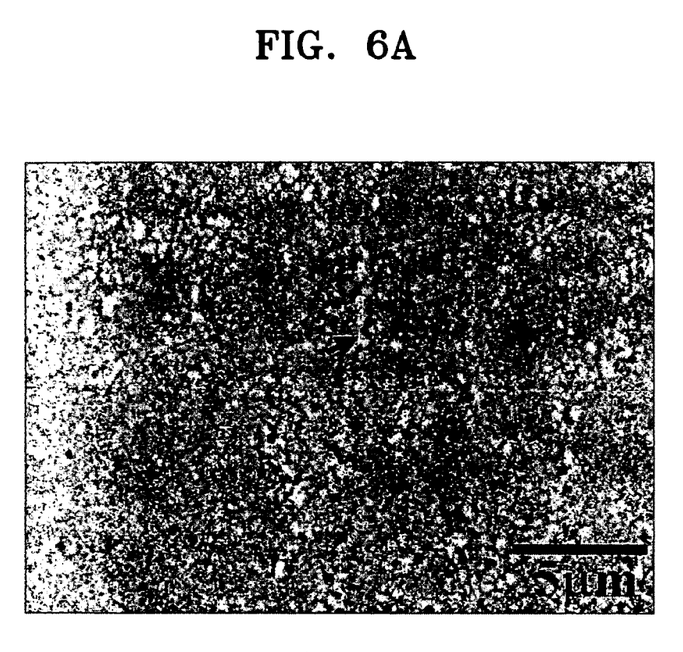
FIGS. 6A and 6B are SEM images illustrating morphology variation of a surface of specimens not processed with Ar plasma and processed with Ar plasma after RTA at approximately 650° C.
Figure 6B:
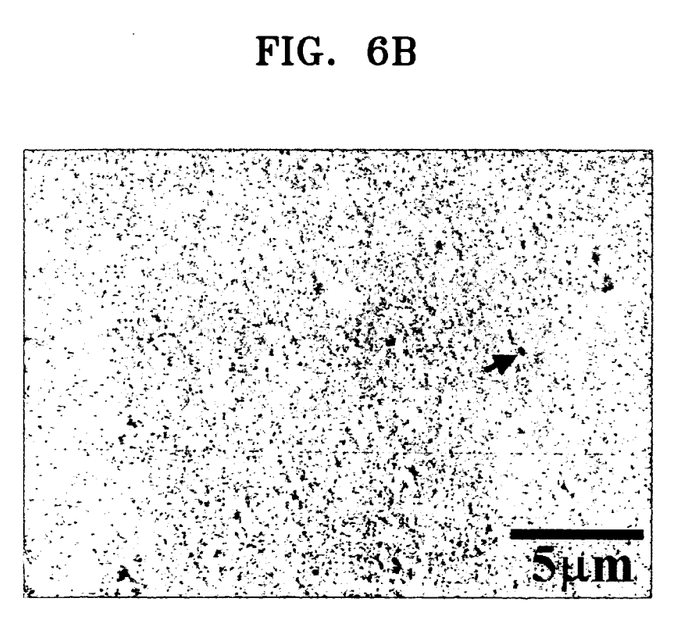

FIGS. 6A and 6B are SEM images illustrating a morphology variation of a surface of a specimen not processed with Ar plasma and a surface of a specimen processed with Ar plasma after RTA at approximately 650° C.

Figure 7A:
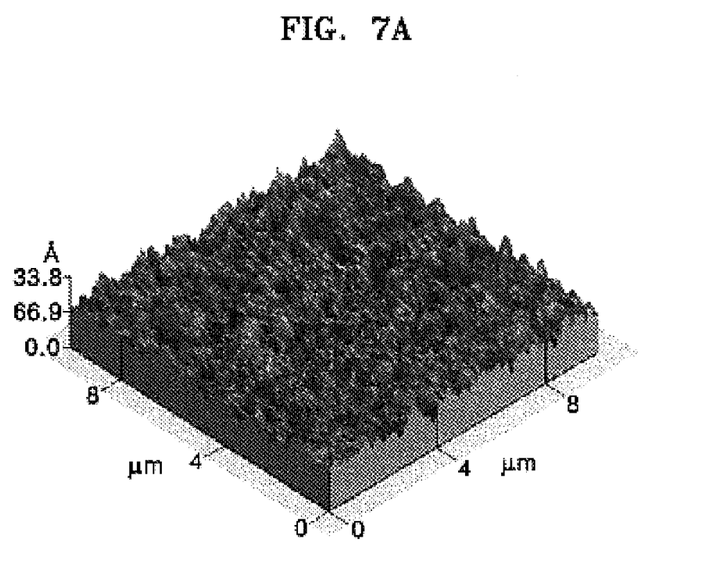
FIGS. 7A and 7B are AFM images of illustrating morphology variation of a surface of specimens not processed with Ar plasma and processed with Ar plasma after RTA at approximately 650° C.
Figure 7B:
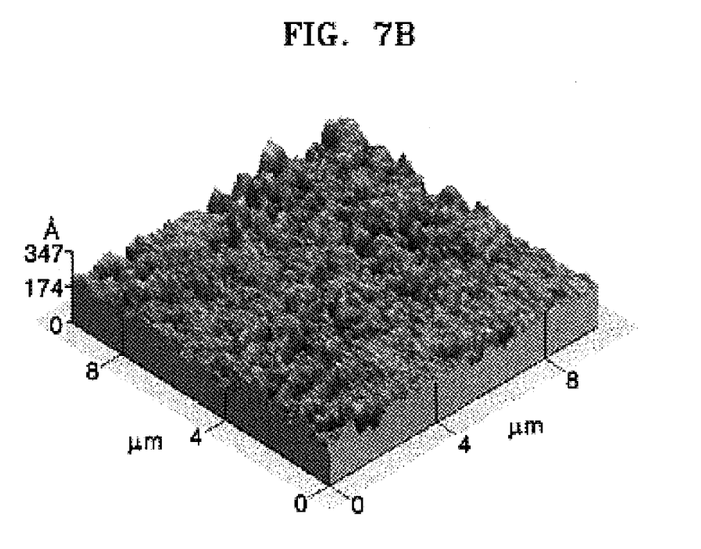

FIGS. 7A and 7B are AFM images illustrating a morphology variation of a surface of a specimen not processed with Ar plasma and a surface of a specimen processed with Ar plasma after RTA at approximately 650° C.

Referring to FIGS. 6 and 7, as depicted in FIGS. 6A and 6B, the specimen processed with Ar plasma has far fewer Si regions (indicated by the arrows in FIGS. 6A and 6B) uncovered by the silicide due to the agglomeration of the silicide than that of the specimen not processed with Ar plasma.

Also, as depicted in FIGS. 7A and 7B, the root mean square (RMS) of surface roughness in identical specimens were measured using an AFM, and the measurement results show that the specimen processed with Ar plasma has an RMS of approximately 16 Å and the specimen not processed with Ar plasma shows 27.8 Å. That is, from the SEM and AFM results, it is seen that the Ar plasma processing improves the surface morphology by preventing agglomeration of the NiSi thin film.

Figure 8A:
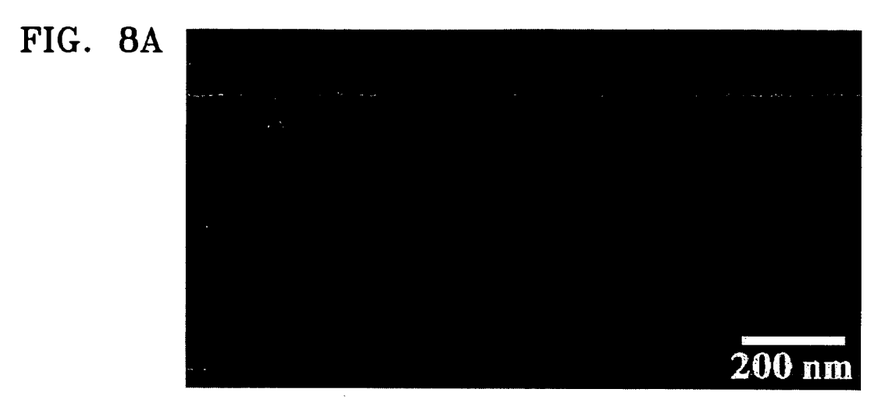
FIGS. 8A through 8C are TEM images of cross-sections of one specimen not processed with Ar plasma and two specimens processed with Ar plasma after RTA at approximately 650° C.
Figure 8B:
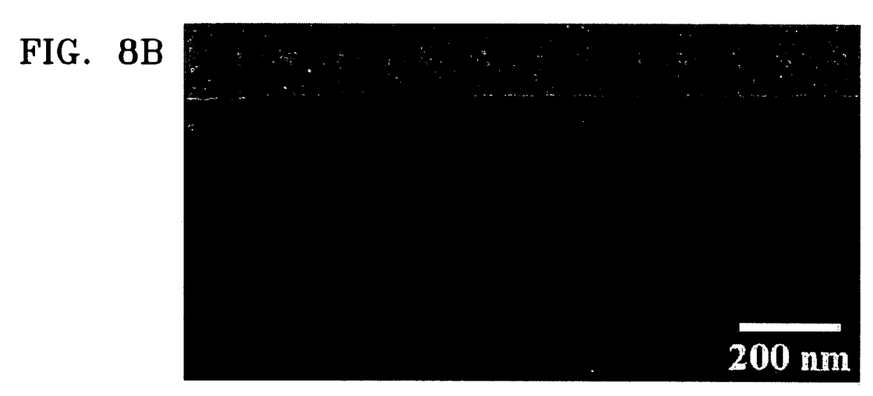
Figure 8C:
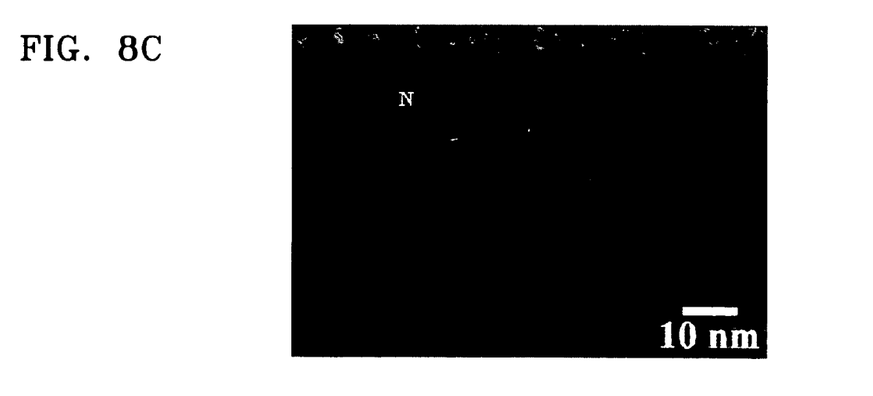

FIGS. 8A through 8C are TEM images of cross-sections of one specimen not processed with Ar plasma and two specimens processed with Ar plasma after RTA at approximately 650° C.

Referring to FIG. 8A, the specimen not processed with Ar plasma has many thermal grooves formed at an interface between the NiSi and the silicon substrate as indicated by the arrows. The formation of the thermal groove denotes that severe agglomeration occurs in the specimen not processed with Ar plasma.

However, as shown in FIG. 8B, a uniform interface between the NiSi and the silicon substrate is observed in the specimen processed with Ar plasma.

Also, as shown in FIG. 8C, the formation of a new layer N on a surface of a specimen processed with Ar plasma is observed in a high resolution TEM image.

Figure 9A:
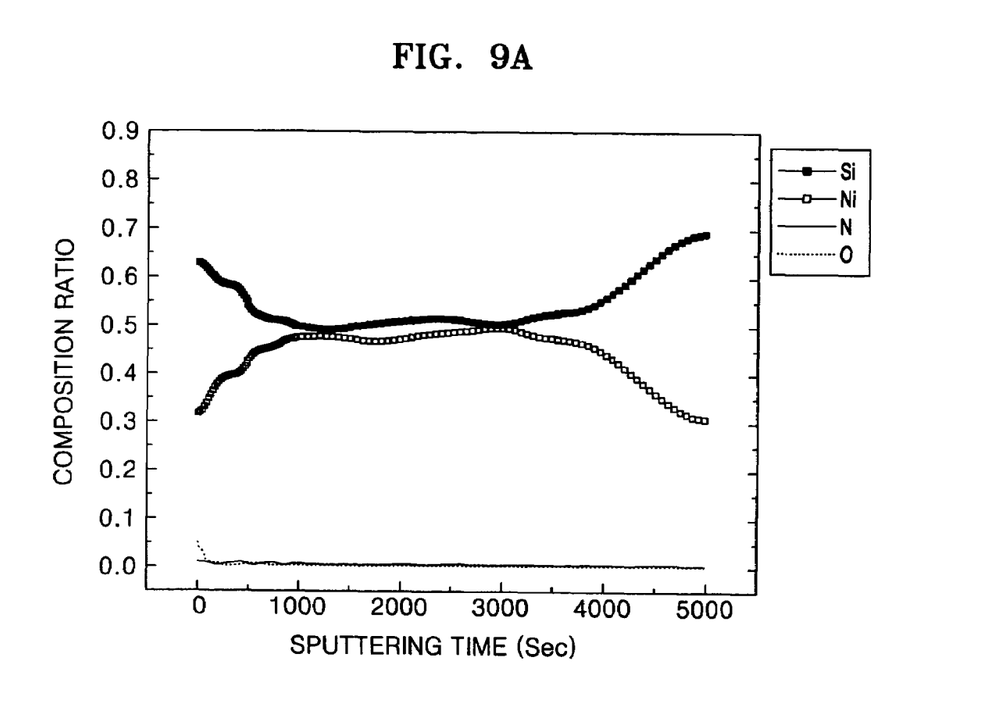
FIGS. 9A and 9B are graphs illustrating depth profiles of elements existing in a specimen not processed with Ar plasma and a specimen processed with Ar plasma measured using AES after RTA at approximately 650° C.
Figure 9B:
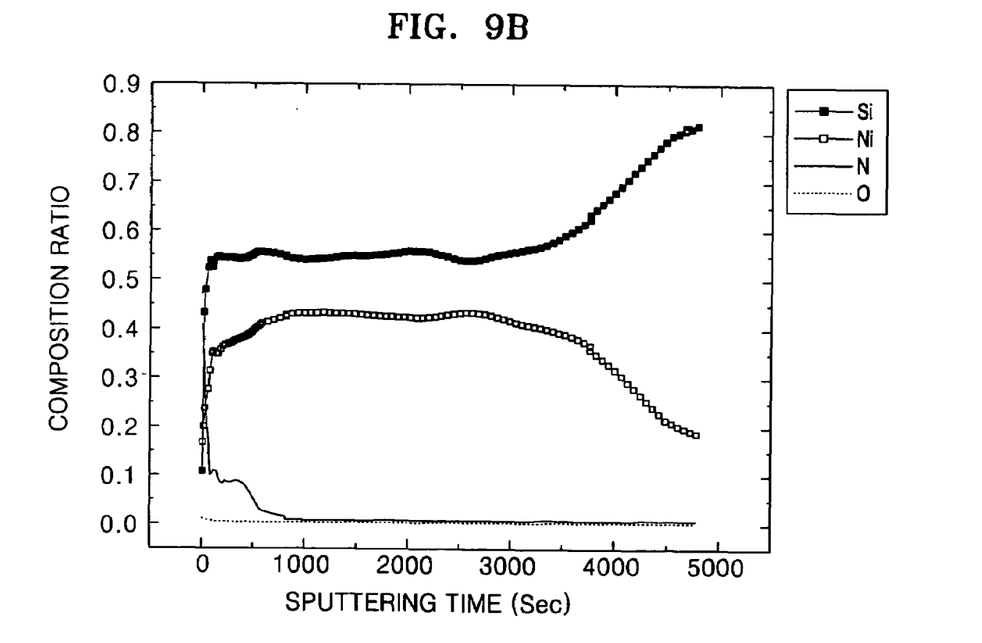

FIGS. 9A and 9B are graphs illustrating depth profiles of elements existing in a specimen not processed with Ar plasma and a specimen processed with Ar plasma using AES after RTA at approximately 650° C.

Referring to FIGS. 9A and 9B, when quantifying the distribution of elements existing in identical specimens through AES analysis, there is a large difference in elements existing on surfaces on which Ar plasma processing was performed, and on surfaces on which Ar plasma processing was not performed.

That is, as depicted in FIG. 9A, when comparing surfaces of the two specimens, in the specimen not processed with Ar, it is seen that a certain amount of oxygen exists on the surface at the same time as the amount of Si increases. This indicates that oxidation occurs on the surface of the specimen not processed with Ar plasma due to oxygen contamination.

On the other hand, as depicted in FIG. 9B, the existence of a large amount of nitrogen is observed instead of oxygen in the specimen processed with Ar plasma. That is, the new layer existing on the surface of the specimen processed with Ar plasma observed in FIG. 8C is formed by nitridation of the surface of the NiSi thin film formed after the RTA process.

The superiority of the uniform surface morphology and interface uniformity of the NiSi thin film of the specimen processed with Ar plasma according to an embodiment of the present invention over the specimen not processed with Ar plasma can be explained in the following reasons.

As indicated by the disclosure of F. Deng et al., published in J. Appl. Phys., 81, pp 8047, 1997, the nitridation of NiSi thin film with the nitrogen used as an ambient gas during the RTA process can be a relatively difficult process since Ni does not readily react with nitrogen.

However, when the Ni surface is processed with Ar plasma, the Ni surface is significantly activated. Then, the nitridation on the surface of the NiSi thin film readily occurs due to a reaction with nitrogen used as the ambient gas during RTA. The nitridation on the surface of the NiSi thin film acts as a diffusion barrier against oxygen that could occur during RTA with a uniform reaction between Ni and Si. As a result, the surface morphology of the NiSi and the interface uniformity between the NiSi and the silicon substrate can be improved.

Also, based on the results of the SEM, the TEM, and the AES, the low sheet resistance observed in FIG. 2 of the specimen processed with Ar plasma results from the improved surface morphology of the NiSi and the interface uniformity between the NiSi and the silicon substrate. As indicated by the disclosures of F. L. Via et al., published in J. Vac. Sci. & Tech. B, 16, pp 1129, 1998 and Choi et al., published in Japan. J. Appl. Phys., 41, pp 1969, 2002, the non-uniformity of the surface morphology of the NiSi and a non-uniform interface cause scattering that can interfere with the flow of electrical carriers, thereby increasing sheet resistance.

That is, the low sheet resistance of the specimen processed with Ar plasma according to an embodiment of the present invention is the result of the improved surface morphology of the NiSi and the interface uniformity between the NiSi and the silicon substrate.

An annealing process performed at a relatively high temperature after a silicide process is essential in a semiconductor manufacturing process. Therefore, silicide with superior thermal stability must be used to manufacture a silicon device having superior performance.

Figure 10:
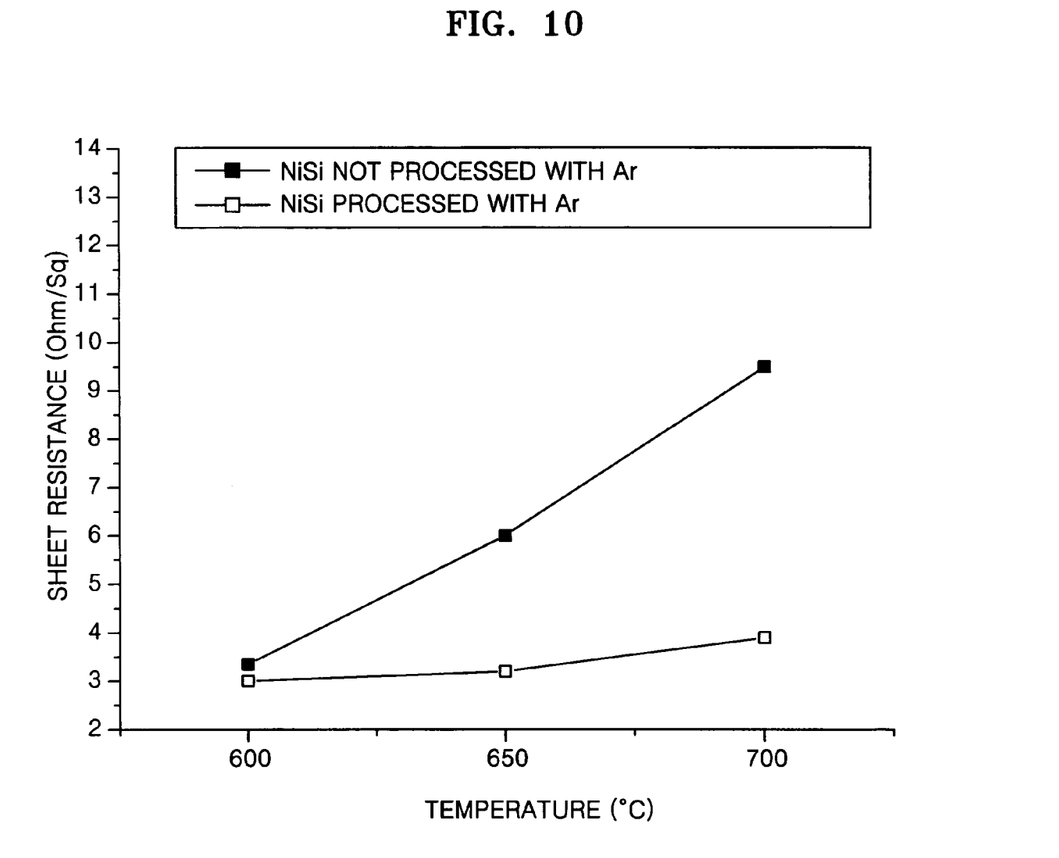
FIG. 10 is a graph illustrating sheet resistance of specimens not processed with Ar plasma and processed with Ar plasma after a second annealing.

FIG. 10 is a graph illustrating sheet resistance of specimens not processed with Ar plasma and processed with Ar plasma after a second annealing.

That is, the graph illustrating sheet resistances measured using a four-point probe after annealing a specimen in two-steps to examine the thermal stability of the specimen processed with Ar plasma. In the first step, the specimen was RTA treated at a temperature of approximately 600° C. and unreacted Ni was removed. Next, the specimen was annealed a second time at temperatures of approximately 600, 650, and 700° C. for 30 minutes at each temperature in a tube furnace under a nitrogen atmosphere.

Referring to FIG. 10, as the temperature of the second annealing increased, the sheet resistance of the specimen □ processed with Ar increased much less than the specimen ■ not processed with Ar plasma. The result shows that the thermal stability of the specimen processed with Ar plasma is very superior to that of the specimen not processed with Ar plasma.

The superiority in the thermal stability of the specimen □ processed with Ar plasma can be explained by the lack of agglomeration of the NiSi. Agglomeration is the main cause of a degradation of the thermal stability of the silicide and is composed of a first stage in which thermal grooves are formed and a second stage in which silicide islands are spontaneously generated to reduce surface energy and interfacial energy of the silicide.

That is, the agglomeration of the silicide has a close relationship with the formation of a thermal groove. From the TEM result shown in FIG. 8B, it is seen in the specimen processed with Ar plasma that thermal grooves are not formed at the interface between the NiSi and the silicon substrate after the first RTA treatment. Accordingly, the superiority of thermal stability in the specimen processed with Ar plasma can be explained from the fact that the rate of agglomeration on the specimen processed with Ar plasma in the second annealing process is less than the rate of agglomeration on the specimen non-processed with Ar plasma in which a greater number of thermal grooves are formed after the first RTA.

It is noted that all theses and documents including contents and papers related to the present specification and open to the public at the time of preparing the present application are adopted in the specification of the present invention as references.

In a method of manufacturing a semiconductor device having a NiSi thin film with thermal stability according to an embodiment of the present invention, when a NiSi thin film is manufactured by Ar plasma processing before RTA processing, and then RTA processing, a semiconductor device having a NiSi thin film with a low sheet resistance and thermal stability can be manufactured.

Accordingly, when commercializing the method of manufacturing a semiconductor device having a NiSi thin film with thermal stability according to an embodiment of the present invention by applying the method to a practical silicon device or a next generation ULSI device, a high quality semiconductor device can be effectively manufactured and also the competitiveness of the product can be increased by maximizing the performance of the device.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A method of manufacturing a semiconductor device that includes a gate oxide film, a gate electrode containing Si and source/drain region on a Si substrate, comprising:
   forming a metal layer on the gate electrode and the source/drain region;
   processing a surface of the metal layer using Ar plasma; and
   forming a silicide thin film and a nitride film by annealing the metal layer formed on the silicon substrate at a predetermined temperature, wherein the silicide thin film is formed by a reaction between the metal layer and the gate electrode and the source/drain region, and the nitride film is formed by a reaction between the metal layer and nitrogen.

2. The method of claim 1, wherein the silicon substrate is composed of a material containing Si selected from the group consisting of single crystal Si, poly crystal Si, doped Si, amorphous Si, $Si_xGe_{1-x}$ (x is 0<x<1), $Si_xN_{1-x}$ (x is 0<x<1), and SiC.

3. The method of claim 1 further comprising removing an unreacted metal layer after forming the silicide thin film.

4. The method of claim 1, wherein the metal layer is a Ni layer.

5. The method of claim 4, wherein the silicide thin film is a NiSi thin film.

6. The method of claim 1, wherein the metal layer has a thickness of from about 10–100 nm.

7. The method of claim 1, wherein the nitride film is composed of one selected from the group consisting of NiSiN, SiN, and NiN.

8. The method of claim 1, wherein the nitride film is removed after forming the silicide thin film.

9. The method of claim 4, wherein the surface of the metal layer is processed with Ar plasma under approximately 25–35 W of RE power, approximately 900–1100 W of ICP power, and a flow rate of an approximately 15–25 sccm of Ar using ICP.

10. The method of claim 1, wherein the annealing is processed by RTA at a temperature of approximately 300–800° C. under a nitrogen atmosphere for a predetermined time to form a silicide thin film.

11. The method of claim 1, wherein the temperature range of annealing is determined considering the kind of metal silicide to be formed and temperature range at which the metal silicide is formed.

12. The method of claim 9, wherein, when the silicide thin film is composed of NiSi, the predetermined temperature range for annealing is approximately 300–800° C.

13. The method of claim 1, wherein the semiconductor device is one of a CMOS logic device, a memory device, and an embedded memory device.

14. A method of manufacturing a semiconductor device having a NiSi thin film, comprising:
   sequentially forming a gate oxide film layer and a gate electrode layer on a silicon substrate that contains Si;
   forming a gate electrode and a gate oxide film by patterning the gate oxide film layer and the gate electrode layer to a predetermined shape;
   forming a LDD region in the silicon substrate using the gate oxide film and the gate electrode as a mask;
   forming spacers on side walls of the gate oxide film and the gate electrode;
   forming a source/drain region using the gate electrode and the spacers as a mask;

forming a Ni layer on the gate electrode and the source and drain region;

processing a surface of the Ni layer with Ar plasma; and forming NiSi and a nitride film by annealing the Ni layer at a predetermined temperature.

15. The method of claim 14, wherein the silicon substrate is composed of a material containing Si selected from the group consisting of single crystal Si, poly crystal Si, doped Si, amorphous Si, $Si_xGe_{1-x}$ (x is 0<x<1), $Si_xNi_{1-x}$ (x is 0<x<1), and SiC.

16. The method of claim 14 further comprising removing an unreacted metal layer after forming the NiSi layer.

17. The method of claim 14, wherein the surface of the Ni layer is processed with Ar plasma under approximately 25–35 W RE power, approximately 900–1100 W of ICP power, and a flow rate of approximately 15–25 sccm of Ar using ICP.

18. The method of claim 14, wherein, when the silicide thin film is composed of NiSi, the predetermined temperature range for annealing is approximately 300–800° C.

19. The method of claim 14, wherein the semiconductor device is one of a CMOS logic device, a memory device, and an embedded memory device.

20. The method of claim 1, wherein the silicide thin film and the nitride film are formed simultaneously.

21. The method of claim 1, wherein the metal layer is rapid thermal annealed in the presence of nitrogen gas.

22. The method of claim 14, wherein the Ni layer is rapid thermal annealed in the presence of nitrogen gas.

23. The method of claim 8, comprising annealing the NiSi layer after removing the unreacted metal layer.

24. The method of claim 16, comprising annealing the NiSi layer after removing the unreacted metal layer.

* * * * *